United States Patent [19]

Goldie et al.

[11] 4,155,054

[45] May 15, 1979

[54] MICROWAVE YIG POWER LIMITER USING ELECTRICALLY THIN IRIS

[75] Inventors: Harry Goldie, Randallstown; Steven N. Stitzer, Ellicott City, both of Md.

[73] Assignee: The Unites States of America as represented by the Secretary of the Air Force, Washington, D.C.

[21] Appl. No.: 854,449

[22] Filed: Nov. 23, 1977

[51] Int. Cl.² .............................................. H01P 1/22
[52] U.S. Cl. .................................. 333/17 L; 333/248; H01P/5/04
[58] Field of Search ................... 333/17 L, 24.2, 73 W

[56] References Cited

U.S. PATENT DOCUMENTS

| | | | |
|---|---|---|---|
| 3,040,276 | 6/1962 | Trambarulo et al. | 333/24.2 |
| 3,480,888 | 11/1969 | Elliott | 333/24.2 X |
| 3,500,256 | 3/1970 | Carter et al. | 333/17 L |

Primary Examiner—Paul L. Gensler
Attorney, Agent, or Firm—Joseph E. Rusz; Robert Kern Duncan

[57] ABSTRACT

A ferrimagnetic sphere that is biased to the subsidiary resonance mode and placed within a microwave slotted resonant structure functions as a frequency selective microwave power limiter. When the power level of a signal at the input port exceeds a threshold level, the device prevents the power level at the output port from increasing further. A weak signal present simultaneously passes with relatively little attenuation if it is slightly offset in frequency.

6 Claims, 7 Drawing Figures

MICROWAVE YIG POWER LIMITER USING ELECTRICALLY THIN IRIS

RIGHTS OF THE GOVERNMENT

The invention described herein may be manufactured or used by or for the Government of the United States for all governmental purposes without the payment of any royalty.

BACKGROUND OF THE INVENTION

The field of the invention is in the microwave art and more particularly in the microwave passive frequency selective filter art.

Frequency selective power limiters have application as receiver protectors in radar and communications systems. As opposed to limiters of the plasma, plasma-diode, diode and ferri-diode types which attenuate all signals in the passband in the presence of an above-threshold strong signal, the disclosed frequency selective limiter provides the capability of simultaneous low-loss transmission of a below-threshold signal which is offset slightly in frequency from the strong signal.

The best known prior art may be found in the following patents; U.S. Pat. No. 3,016,535 to patentee W. H. Hewitt, Jr.; U.S. Pat. No. 3,183,511 to patentee J. S. Ajioka; and U.S. Pat. No. 3,266,043 to patentee F. J. Goebels, Jr.

SUMMARY OF THE INVENTION

The invention provides a microwave frequency selective power limiter with low loss transmission of below-threshold signals which are slightly offset from the designed power limitng selected frequency.

DESCRIPTION OF THE PREFERRED EMBODIMENTS

Figure 1:
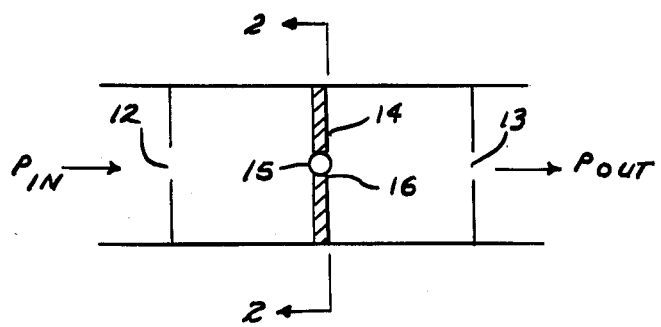
FIG. 1 is a schematic diagram illustrating the interior structure of a waveguide containing an embodiment of the invention.
Figure 2:
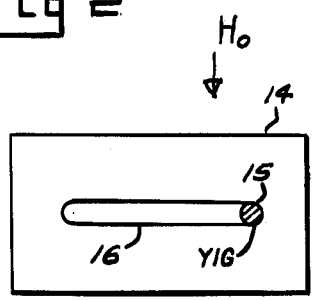
FIG. 2 schematically illustrates the transverse microwave resonant structure of FIG. 1.

Referring to FIGS. 1 and 2, a ferrimagnetic sphere (YIG) 15 is placed in a region of high RF magnetic field intensity in a resonant (slot) iris structure. An external static magnetic field $H_o$ is applied transverse to the direction of propagation of RF energy. The strength of the H-field is made to bias the ferrite or YIG into the subsidiary resonance mode. Spin waves at one-half the RF signal frequency are excited by the RF magnetic field. Above a certain signal strength the spin wave amplitude saturates, and no further increase in amplitude can occur. If the input signal level increases further, the excess power is coupled through the spin waves into lattice vibrations, whereby it is converted to heat. Thus, the output power level will not increase further. If another signal whose level is below threshold is present simultaneously, but offset in frequency, its spin wave system does not interact with that of the limited signal, and it therefore suffers little attenuation. This disclosure teaches the placement of YIG (or Ferrite) spheres within an electrically thin resonant iris as shown in FIGS. 1 through 5. The major advantages of this novel configuration are:

(a) Since the ferrimagnetic (or YIG) material is placed in a resonant structure the RF magnetic field intensity is enhanced by the Q of the resonator, thus lowering the limiting threshold, which is generally a desirable feature in microwave power limiters.

(b) Furthermore, several of these states, having identical or different limiting thresholds, may be cascaded in accordance with well known filter design techniques to achieve the desired bandpass characteristic for below-threshold signals.

(c) the ferrimagnetic (or YIG) material is placed in intimate contact with the metallic structure of the iris, thus providing better heat sinking than most other arrangements, which in turn permits operation at higher power levels.

Figure 3:
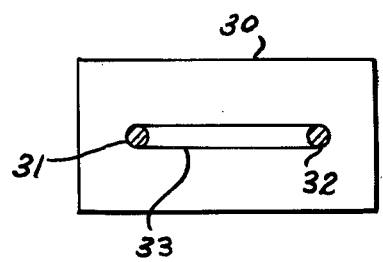
FIG. 3 schematically illustrates an embodiment of the invention having two ferrite spheres.

In the simplest embodiment of the invention as illustrated in FIGS. 1 and 2, a YIG (yttrium-iron-garnet) sphere 15 is placed in the end of the slot 16 of iris resonator 14. The YIG sphere may be either cemented (epoxied) into the slot, or it may be pressed into the end of the slot and held there by a slight interference fit. The RF microwave signal energy, $P_{in}$, enters the waveguide section through coupling hole 12 and exits the section through coupling hole 13 into the continuing waveguide. Conventional coupling to a coaxial cable may be provided at either or both ends of the waveguide section. The RF magnetic field intensity is strongest at the ends of the iris slot 16. In a typical embodiment for X-band frequencies conventional X-band (0.4×0.9 inch) waveguide is used and a slot iris 16, that is approximately 0.03 inches by 0.615 inches, is formed in metallic member 14 (conventional waveguide material is suitable). The thickness of the iris is determined by the thickness of plate 14 which is typically $\leq 10°$ thick, i.e. 1/36 of a wavelength. In this particular X-band embodiment that is approximately 0.03 inches thick. In this embodiment the iris resonates at approximately 9.7 gHz and has a loaded Q of about 6. The limiting action from a single sphere is minimal and will generally be less than normally desired. Two spheres, 31 and 32, one at each end of the slot iris 33 as illustrated in FIG. 3 provide better limiting, but even with the two YIG spheres 0.03 inch in diameter positioned at the ends of a 0.03 slot, the interaction is relatively weak and only a small amount of limiting action occurs.

Figure 4:
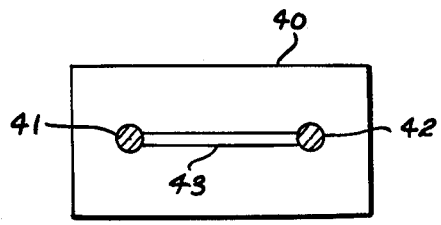
FIG. 4 schematically illustrates an embodiment of the invention having ferrite spheres that are larger than the iris slot.

It has been found that by increasing the diameter of the YIG spheres to 0.05 inch diameter and positioning them in enlargements at the ends of the 0.03 inch wide iris, that greatly improved limiting takes place. This is illustrated in FIG. 4. The ends of the 0.03 inch iris slot 43 have been enlarged and 0.05 inch YIG spheres 41 and 42 cemented or pressed therein.

The enlarged ends of the iris create a region of intensified RF magnetic field strength, thereby enhancing limiting action. Also, the enlarged holes allow the use of spheres which are larger than the width of the slot. Thus, large spheres can be used without enlarging the entire slot, which would have the effect of lowering the iris Q. Lower Q results in both higher limiting threshold and increased below-threshold insertion loss.

Figure 6:
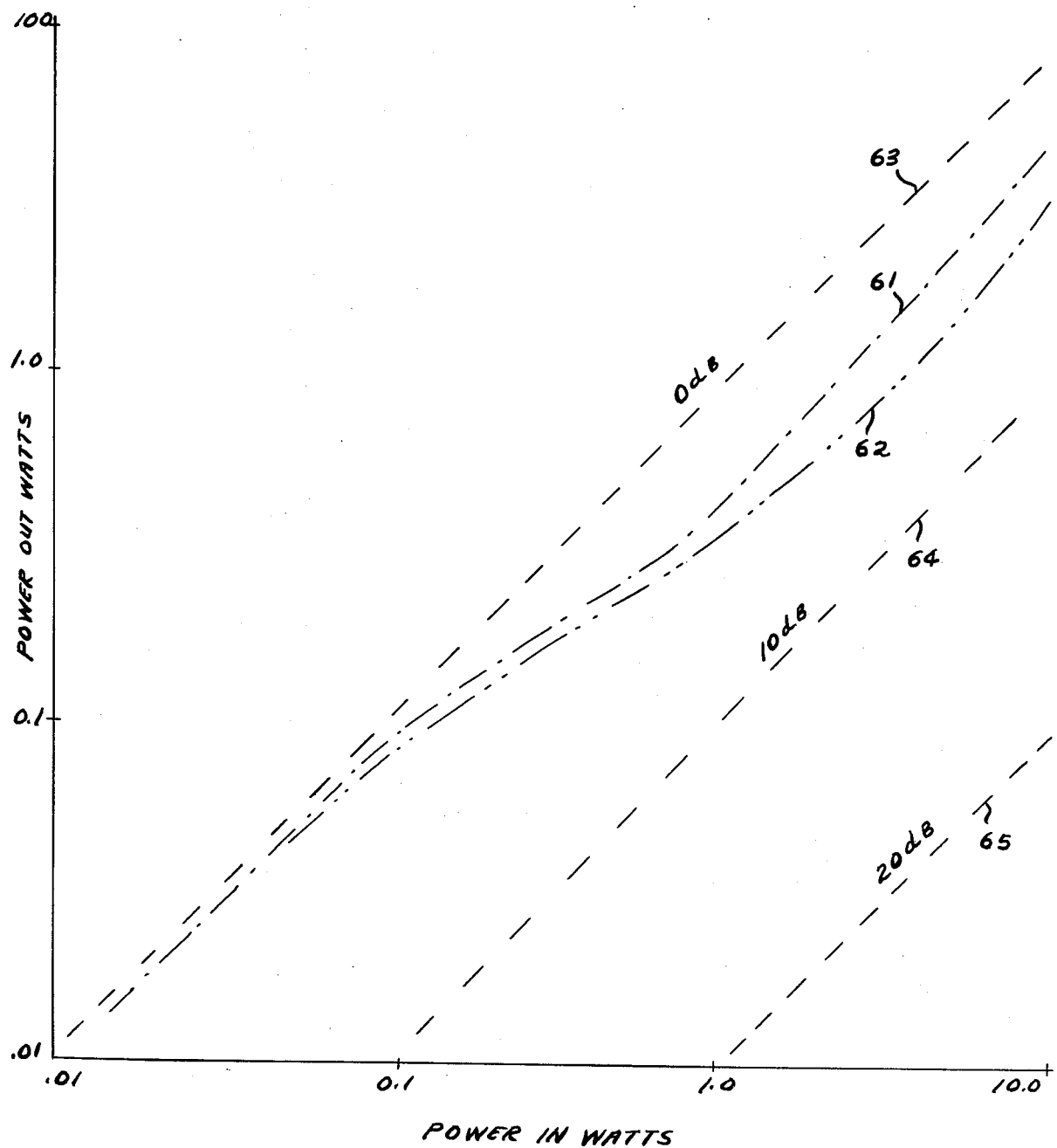
FIG. 6 is a plot illustrating typical characteristics of embodiments as illustrated by FIG. 4.

The characteristics of embodiments constructed as illustrated in FIG. 4 in X-band waveguide with two 0.05 inch diameter YIG spheres at the ends of a 0.03 inch slot, at a frequency of 9.2 GHz, with a magnetic field $H_o$ of approximately 1800 oersteds, is illustrated by curve 61 on attentuation chart shown in FIG. 6. Curve 63 is for zero loss (attenuation), curve 64 is the 10 dB line and curve 65 is the 20 dB line.

If two or more such stages are cascaded, a predictable bandpass response is obtainable. Also, the dynamic range of the limiting action is increased. This is especially true if the limiting threshold of subsequent stages is made lower than that of early stages. The limiting threshold may be controlled by varying the sphere size and/or position in the iris. Two identical iris plates of the form shown in FIG. 4 spaced one-quarter wavelength apart (at the center frequency of the loaded iris resonance) provides limiting action as shown by curve 62 of FIG. 6. The pass band response also agrees well with the theoretically predicted response for two coupled resonators.

Figure 5:
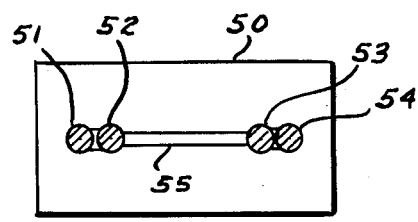
FIG. 5 schematically illustrates an embodiment of the invention having double ferrite spheres of the ends of a resonant slot.

Greater coupling between the RF magnetic field and the YIG may be obtained with two spheres placed in direct contact with each other at each end of the iris slot as illustrated in FIG. 5. YIG spheres 51 and 52 are positioned together in a recess at the one end of iris slot 55 and spheres 53 and 54 are at the other end of the slot. These embodiments with double 0.05 inch diameter YIG spheres at each end provided approximately 6.5 dB of limiting (curve 71, FIG. 7), at approximately 3 watts input, with less than 0.4 dB insertion loss. The resonant frequency of this embodiment shifted down to 8.5 GHz from the former 9.76 Hz due to the end enlargements and the presence of the biased YIG.

Figure 7:
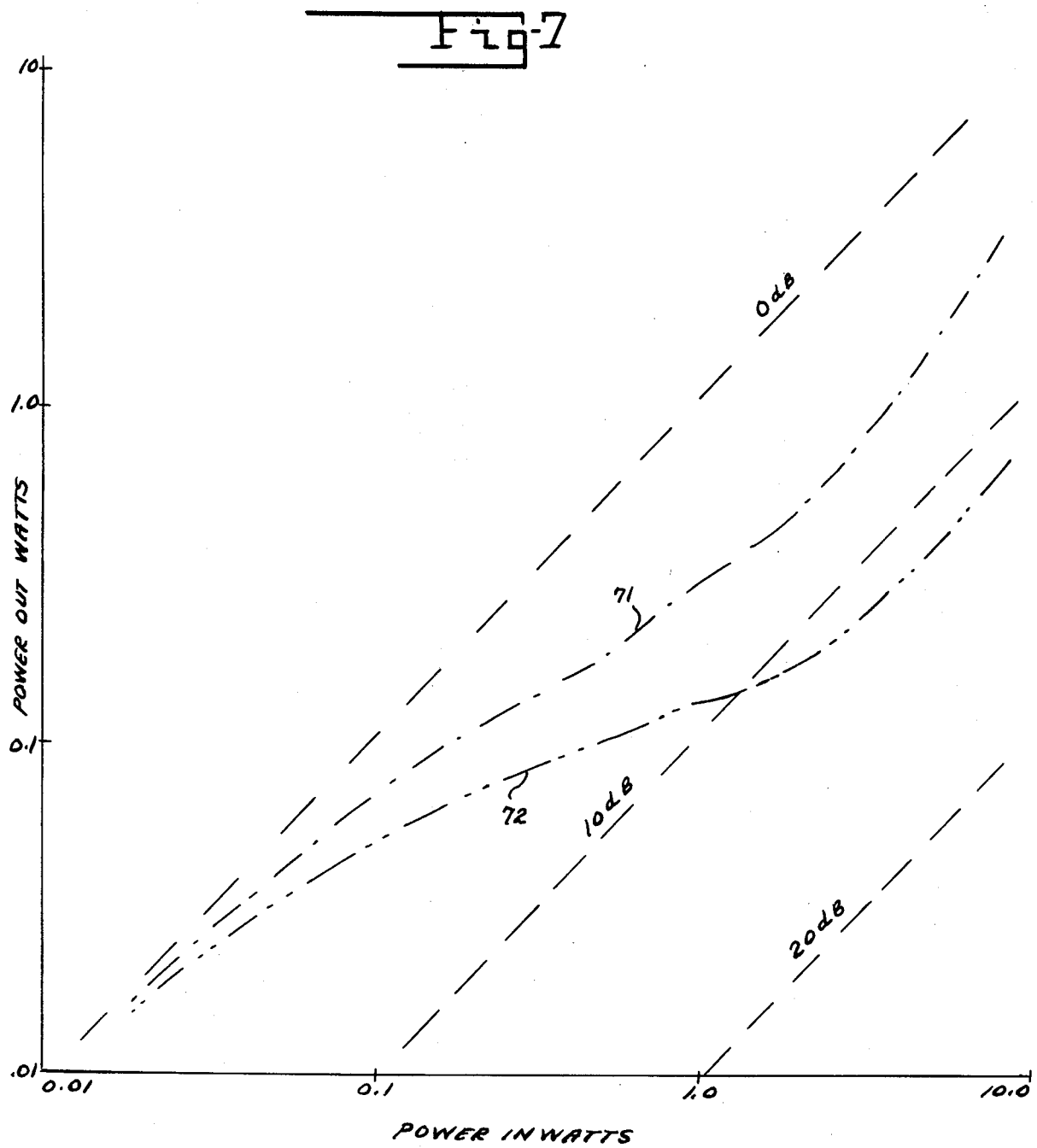
FIG. 7 is a plot illustrating typical characteristics of embodiments as illustrated by FIG. 5.

The limiting action of two quarter-wave coupled iris limiter stages is shown by curve 72 in FIG. 7. The bias fields for all the illustrated embodiments was approximately 1800 Oe, which gives good limiting action over the frequency range 6760 to 10630 MHz.

We claim:

1. A microwave frequency selective power limiter for a propagating microwave signal in a waveguide comprising:
    a. an electrically thin metallic member having a resonant iris slot positioned in the said waveguide transverse to the propagating microwave signal;
    b. a ferrimagnetic sphere positioned at an end of the said slot; and
    c. a static external magnetic field applied transverse to the direction of the said propagating signal biasing the said ferrimagnetic sphere into a subsidiary resonance mode.

2. The apparatus as claimed in claim 1 wherein the said ferrimagnetic spheres is a YIG (yttrium-iron-garnet) sphere.

3. The apparatus as claimed in claim 1 wherein the said electrically thin metallic member is $\leq$ approximately 10° thick.

4. A frequency selective power limiter for X-band propagating energy comprising:
    a. a section of X-band waveguide for containing the said propagating energy;
    b. a first and a second YIG sphere approximately 0.05 inches in diameter;
    c. an electrically thin metallic structure positioned in the said waveguide having a 0.03 inch wide resonant iris slot with the ends of the said slot enlarged to receive in contacting relationship the 0.05 inch YIG spheres;
    d. means for positioning the said first YIG sphere in one end of the said slot and the said second YIG sphere in the other end of the said slot, both in contacting relationship to the said metal structure having the said slot; and
    e. a static magnetic field transverse to the said slot and transverse to the said propagating energy.

5. The apparatus as claimed in claim 4 wherein the said electrically thin metallic structure is approximately 0.03 inches thick and the said magnetic field is approximately 1800 oersted.

6. The apparatus as claimed in claim 5 wherein a third and fourth 0.05 inch YIG spheres are positioned in contacting relationship with the said first and second YIG spheres respectively in enlarged ends of the said slot.

* * * * *